United States Patent
Chen et al.

[11] Patent Number: 6,154,093
[45] Date of Patent: Nov. 28, 2000

[54] FAST ADAPTIVE WIDEBAND POWER AMPLIFIER FEED FORWARD LINEARIZER USING A RLS PARAMETER TRACKING ALGORITHM

[75] Inventors: Jiunn-Tsair Chen, New Brunswick; Young-Kai Chen, Berkeley Heights; Huan-Shang Tsai, Parsippany, all of N.J.

[73] Assignee: Lucent Technologies Inc., Murray Hill, N.J.

[21] Appl. No.: 09/053,407

[22] Filed: Apr. 1, 1998

[51] Int. Cl.[7] ............................................. H03F 1/00
[52] U.S. Cl. .................................... 330/151; 330/149
[58] Field of Search ............................ 330/151, 149; 332/107

[56] References Cited

U.S. PATENT DOCUMENTS

| | | | |
|---|---|---|---|
| 5,049,832 | 9/1991 | Cavers | 330/149 |
| 5,489,875 | 2/1996 | Cavers | 330/151 |
| 5,508,657 | 4/1996 | Behan | 330/151 |
| 5,617,061 | 4/1997 | Fukuchi | 330/151 |
| 5,789,976 | 8/1998 | Ghannouchi et al. | 330/52 |
| 5,808,512 | 9/1998 | Bainvoll et al. | 330/151 |

FOREIGN PATENT DOCUMENTS

| | | |
|---|---|---|
| 675594A1 | 4/1995 | European Pat. Off. . |
| 729228A1 | 8/1996 | European Pat. Off. . |

OTHER PUBLICATIONS

Cavers, J.K. "Adaption behavior of a feedforward amplifier linearizer," *IEEE Trans. on Veh. Tech.*, Feb. 1995, vol. 44, No. 1, pp. 31–40.

Grant, S.J., et al., "A DSP controlled adaptive feedforward amplifier linearizer," 5th International Conference on Universal Personal Communications, Cambridge. MA, vol. 2, pp. 788–792.

European Search Report for Application No. 99301791 dated Jun. 30, 1999.

*Primary Examiner*—Robert Pascal
*Assistant Examiner*—Henry Choe

[57] ABSTRACT

A feedforward linearizer for amplifying an input signal comprises a signal cancellation circuit which has a first branch and a second branch. A first amplifier provided in the first branch receives the input signal intended to be amplified and generates an output signal received by a signal cancellation vector modulator. A signal cancellation adder receives the signal generated by the signal cancellation vector modulator and the input signal via the second branch and provides an error signal. The feedforward linearizer also comprises an error cancellation circuit that has a first branch and a second branch. An error cancellation adder in the first branch receives the output signal provided by the first amplifier and generates the output signal of the linearizer. An error cancellation vector modulator in the second branch receives an error signal provided by the signal cancellation adder and provides an error adjusted signal to a second auxiliary amplifier. The second auxiliary amplifier provides an input signal to the error cancellation adder. A digital signal processor provides a signal cancellation adjustment signal, $\alpha$, to the signal cancellation vector modulator and an error cancellation adjustment signal, $\beta$, to the error cancellation vector modulator respectively, such that the output signal of the signal cancellation adder is a signal that substantially represents the error components provided by the first amplifier, and the output signal of the error cancellation adder is an amplified version of the input signal, with substantially no internmodulation components.

17 Claims, 3 Drawing Sheets

FAST ADAPTIVE WIDEBAND POWER AMPLIFIER FEED FORWARD LINEARIZER USING A RLS PARAMETER TRACKING ALGORITHM

FIELD OF THE INVENTION

This invention relates to a wideband power amplifier and specifically to an amplifier having a feed-forward linearizer arrangement employing digital signal processing techniques.

BACKGROUND OF THE INVENTION

In many radio frequency, RF, applications power amplifiers are employed to amplify high frequency signals. Because the RF amplifiers are biased to provide substantially high output power, they exhibit nonlinear responses to some degree. Consequently, in response to an increase in the input signal power, such RF amplifiers generate intermodulation IM components, which may have frequencies that are outside a desired frequency band.

One solution to eliminate the consequences of the nonlinear response of the amplifier is to employ multiple amplifiers each configured to amplify a predetermined carrier signal. For example, in a mobile communications environment, the base station sends multiple carrier signals in accordance with time division multiple access (TDMA) modulation scheme, or in accordance with code division multiple access (CDMA) modulation scheme. Each carrier frequency in TDMA corresponds to one of the users in a specifiable cell. Each pseudo-code in CDMA corresponds to one user. Because the base station has to communicate with many users in the corresponding cell, the intermodulation IM components increase with the number of the users. Thus, the use of a separate amplifier for each carrier signal substantially eliminates the generation of intermodulation IM components. However, this approach is costly and may not be commercially feasible in many applications.

Another approach is to employ an analog linearizer, such as 10 as illustrated in FIG. 1. Basically, a radio frequency signal represented by frequency components 22 is fed to a power amplifier 12. Amplifier 12 generates additional intermodulation IM frequency components 24 because of its nonlinear response characteristics. Signal components 22' correspond to an amplified version of signal components 22. The function of linearizer 10 is to substantially eliminate frequency components 24, as explained in more detail below.

Linearizer 10 includes a signal cancellation circuit 26 coupled to an error cancellation circuit 28. Signal cancellation circuit 28 has an upper branch that includes power amplifier 12, and a lower branch that provides the input signal of the linearizer to an input port of an adder 16. The other input port of adder 16 is configured to receive the output signal generated by power amplifier 12, via an attenuator 14. As a result, the output port of adder 16 provides signal components 24', which correspond to the attenuated version of intermodulation IM frequency components 24.

Error cancellation circuit 28 also includes an upper branch that is configured to provide the output signal generated by amplifier 12 to an adder 20. The lower branch of error cancellation circuit 28 includes an amplifier 18, which is configured to receive the attenuated intermodulation components 24'. Amplifier 18 generates an amplified version of signal 24' which is substantially equal to intermodulation component 24. As a result, the output port of adder 20 provides signal components 22' without the distortion caused by amplifier The feedforward linearizer described in FIG. 1 has some disadvantages. For example, because it is based on analog circuitry, it requires substantially precise components, which may lead to higher manufacturing and maintenance costs.

In order to avoid the problems associated with analog feedforward linearizers, feedforward linearizer employing digital signal processing techniques have been proposed. However, the speed limitations including delays in convergence speeds of calculations performed by such processors, restricts the effectiveness of such feedforward linearizers.

Thus, there is a need for a feedforward linearizer that employs digital signal processing techniques and that provides effective suppression of intermodulation components.

SUMMARY OF THE INVENTION

In accordance with one embodiment of the invention, a feedforward linearizer is employed to amplify an input signal. The linearizer includes a signal cancellation circuit and an error cancellation circuit. The signal cancellation circuit includes a power amplifier that is configured to amplify the input signal. The output of the amplifier is adjusted by the output signal that is provided by a signal cancellation vector modulator. The signal provided by the vector modulator is obtained by a recursive least square mean calculator that employs a recursive least square mean algorithm. A mathematical model of the power amplifier is also defined, wherein the slow varying parameters of the model are separated from the fast varying parameters of the mathematical model. The calculator employs the recursive least square mean algorithm, to calculate the coefficients of the slow varying parameter of the model. The input signal statistics are also obtained based on the knowledge of the input signal characteristics, such as the modulation scheme and the input signal power. The fast varying parameters of the mathematical model are then obtained based on the signal statistics. The calculator converges rapidly because it preferably tracks the slow varying parameters, and not the fast varying parameters. The signal cancellation adjustment signal is then obtained based on the obtained amplifier model.

In accordance with one embodiment of the invention, the first signal cancellation branch includes an amplifier that is configured to receive the input signal intended to be amplified. The output port of the amplifier is coupled to a signal cancellation vector modulator via an attenuator. The output port of the vector modulator is coupled to a signal cancellation adder. The other input of the signal cancellation adder is configured to receive the input signal via the second signal cancellation branch. The feedforward linearizer also includes an error cancellation circuit having a first error cancellation branch and a second error cancellation branch. The first error cancellation branch includes an error cancellation adder configured to receive the output signal generated by said amplifier. The second error cancellation branch includes an error cancellation vector modulator adapted to receive the signal generated by the signal cancellation adder and provide an adjusted error signal. The output port of error cancellation modulator is provided to an auxiliary amplifier, which in turn provides its output signal to the second input port of the error cancellation adder. A digital signal processor is configured to provide a gain and phase adjustment signal to the vector modulators such that the output signal of the signal cancellation adder is a signal that substantially represents the intermodulation components, and the output signal of the error cancellation adder is an amplified version of the input signal, with substantially no intermodulation components.

In accordance with another embodiment of the invention, the processor includes a memory that stores a mathematical model of the amplifier. The coefficients of the mathematical model are then calculated by employing a Recursive Least Square algorithm. The gain and phase adjustment signal α for the signal cancellation modulator is calculated based on the coefficients and input signal statistics. The gain and phase adjustment signal, β, for the error cancellation modulator is also calculated based on a Least Mean Square algorithm.

The processor performs its calculation based on the down converted signals corresponding to the input signal, the output signal provided by the signal cancellation adder and the output signal of the linearizer.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE DRAWINGS

Figure 1:
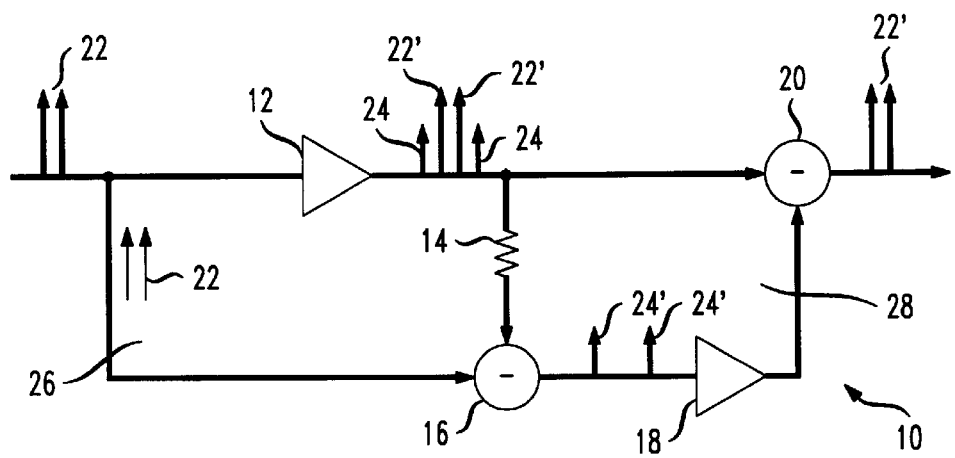
FIG. 1 illustrates a prior art analog feedforward linearizer.
Figure 2:
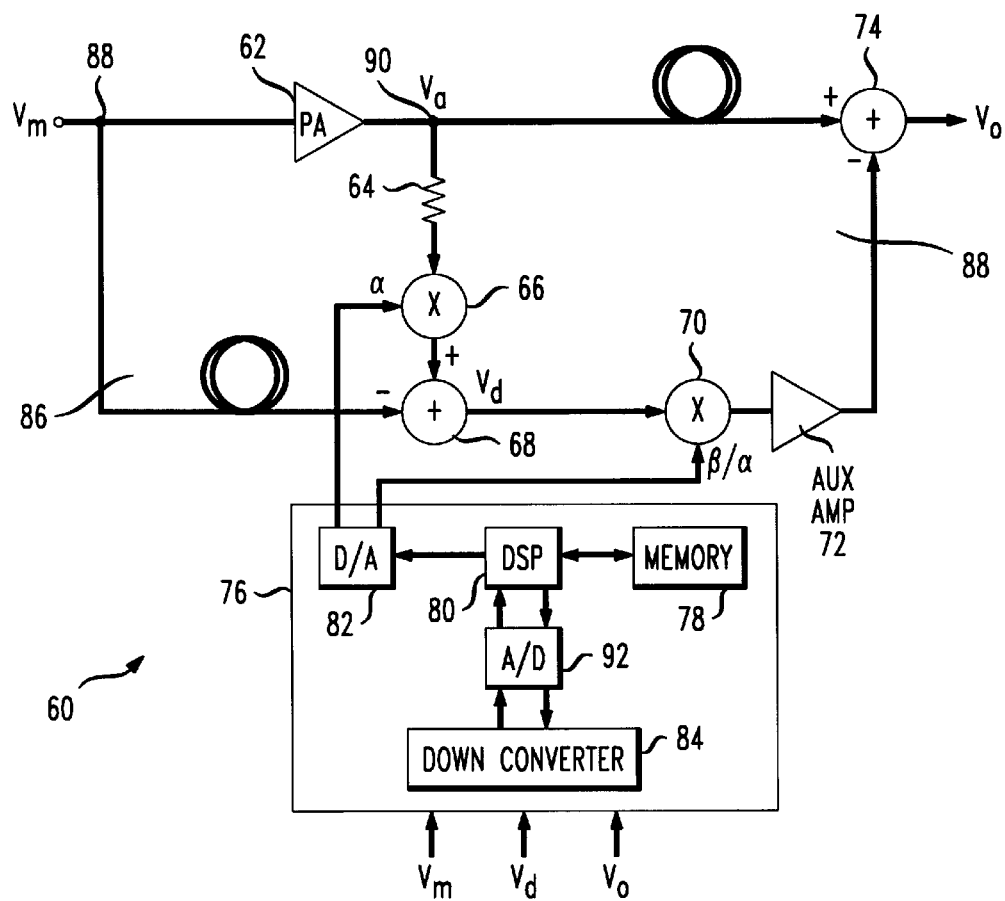
FIG. 2 illustrates a feedforward linearizer in accordance with one embodiment of the invention.

FIG. 2 illustrates a wideband power amplifier feedforward analyzer 60 in accordance to one embodiment of the invention, although the invention is not limited in scope to this embodiment.

Linearizer 60 includes a signal cancellation circuit 86 and an error cancellation circuit 88. Each of the cancellation circuits 86 and 88 have two branches. Thus, signal cancellation circuit 86 includes a first signal cancellation branch that contains an amplifier 62, which is configured to receive an input signal $V_m$. Input signal $V_m$ is also diverted to a second signal cancellation branch via a signal splitter 88.

The first signal cancellation branch also includes a signal cancellation vector modulator 66, which is configured to receive the signal generated by amplifier 62 via a splitter 90 and an attenuator 64. Attenuator 64 may advantageously be a resistor having an attenuation r. An output port of vector modulator 66 is coupled to an adder 68. The other input port of adder 68 is configured to receive the input signal, $V_m$, via the second signal cancellation branch.

Vector modulator 66 is configured to receive a signal cancellation adjustment signal, α, such that, after adjustment, the output signal, $V_a$, generated by the amplifier is substantially orthogonal to the input signal, $V_m$, as will be explained in more detail.

The output port of amplifier 62 is also coupled to a first error cancellation branch of linearizer 60 via signal splitter 90. This error cancellation branch includes an error cancellation adder 74 adapted to receive the signal, $V_a$, at one of its input ports. The second error cancellation branch of linearizer 60 includes an error cancellation vector modulator 70. The output port of vector modulator 70 is coupled to an input port of an auxiliary amplifier 72. The output port of auxiliary amplifier 72 is coupled to the other input port of error cancellation adder 74. Vector modulator 70 is configured to receive an error cancellation adjustment signal, β, such that after adjustment, the signal, $V_d$, generated at the output of adder 68 is substantially orthogonal to signal, $V_o$, generated at the output port of linearizer 60.

A digital signal processor 76 is configured to receive input signal, $V_m$, error signal, $V_d$, and the output signal $V_o$. The digital signal processor includes a down converter circuit 84, which is configured to shift the frequency range of signals, $V_m$, $V_d$ and $V_o$ into the baseband frequency range, although the invention is not limited in scope in that respect. For example, a separate down converter circuit, in accordance with another embodiment of the invention, first shifts the frequencies to the baseband range and then provide the down converted signals to digital signal processor 76.

The output port of down converter circuit 84 is coupled to a digital signal processing circuit 80, which is configured to perform the necessary calculations to track the adjustment signals α and β. In accordance with one embodiment of the invention, digital signal processing circuit 80 is a dedicated processing integrated circuit chip, such as those available from Lucent Technologies, Inc, although the invention is not limited in scope in that respect. For example a dedicated microprocessor executing an appropriate software code can perform the same functions performed by processing circuit 80. A memory device 78 provides data information to digital signal processing circuit 80. The output port of digital signal processing circuit 80 is coupled to a digital to analog D/A converter 82, which converts the calculated parameters to analog signals. The output ports of digital to analog D/A converter 82 is coupled to vector modulators 66 and 70 for providing the analog versions of adjustment signals α and β respectively.

In accordance with a preferred embodiment of the invention, the calculations performed by digital signal processor 76 is based, among other things, on input signal statistics, as will be explained in more detail below. In many radio frequency applications, such as wireless communication systems, the input signal statistics change frequently and suddenly due to the traffic control and the power control. The optimal value of signal cancellation adjustment signal, α, is sensitive to the input signal statistics. Compared to adjustment signal, α, adjustment signal β is slow-varying. Thus, the calculation steps in accordance with the present invention allow for a substantially fast convergence rate for determining adjustment signal, α as explained in more detail below.

Figure 3:
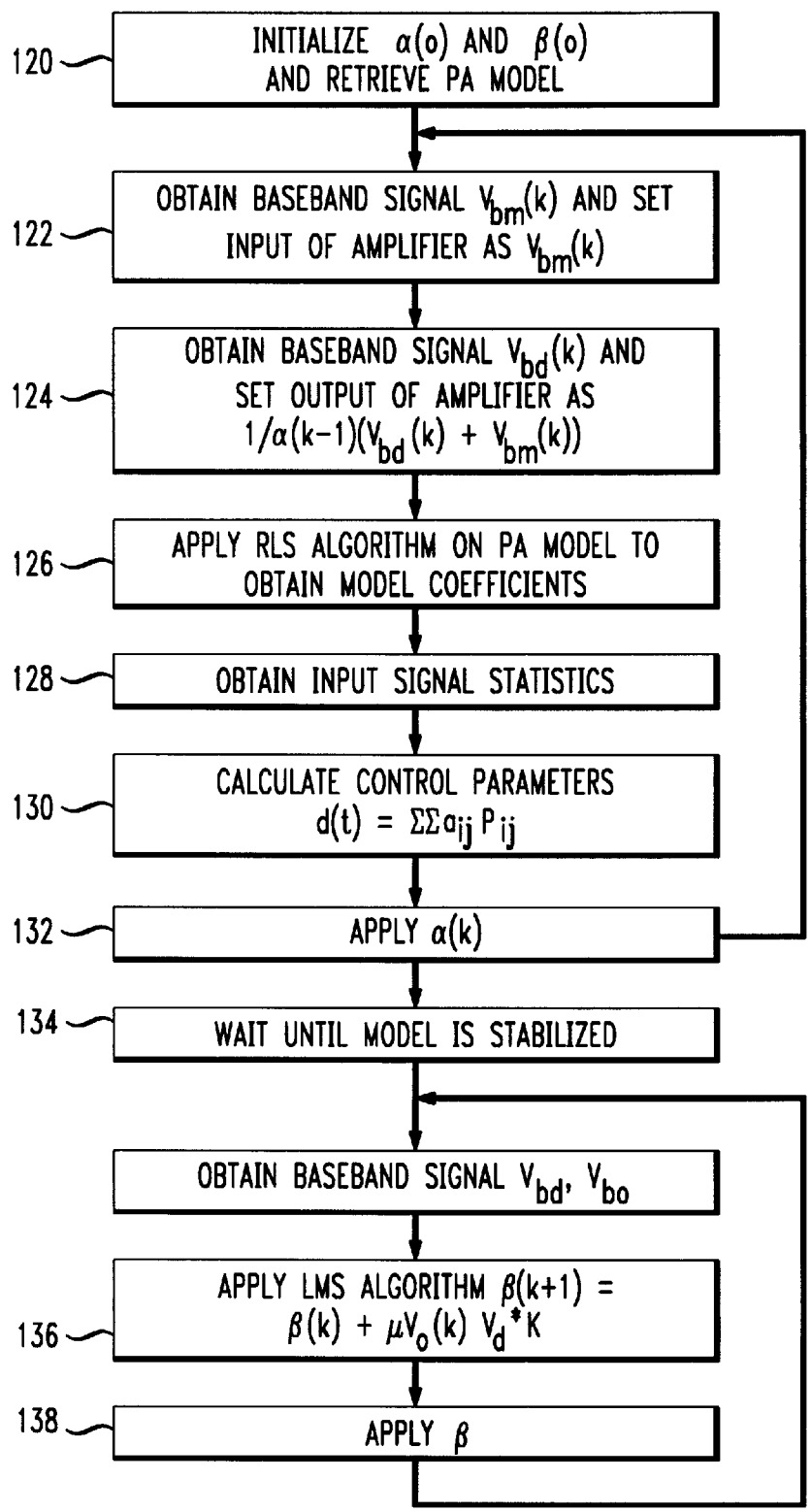
FIG. 3 illustrates a flow diagram of the steps taken by a digital signal processor employed by the feedforward linearizer illustrated in FIG. 2 in accordance with one embodiment of the present invention.

FIG. 3 is a flow chart illustrating the steps accomplished by digital signal processing circuit 80 in accordance with one embodiment of the invention, although the invention is not limited in scope in that respect. At step 120, processing circuit 80 and initializes the values of α(0) and β(0).

At step 122, processing circuit 80 obtains a baseband signal $V_{bm}(k)$ corresponding to input signal $V_m$ and retrieves a mathematical model of amplifier 62 from memory 78. The mathematical mode of amplifier 62 is derived as explained hereinafter. Assuming that amplifier 62 has a memory in time up to $\tau_{mem}$, the amplifier output signal, $V_a$ can be expressed as $$V_a(t) = \zeta(V_m([t-\tau_{mem}, t])) \quad (1)$$

where $[t-\tau_{mem}, t]$ represents the time period between $t-\tau_{mem}$ and $t$. $V_m$ is the amplifier input and $\tau$ is a functional. When the input signal $V_m$ is band-limited with a bandwidth W, equation (1) can be rewritten by using a sampling theory shown as $$V_a(t) = G(V_m(t), V_m(t-mT), V_m(t-2mT), \ldots) \quad (2)$$

where m is the highest non-linear order, and T=1/mW. After conducting a Taylor series expansion on G, assuming G is an analytical function, equation (2) can be written as $$V_a(t) = \sum_{i=0}^{m} \sum_{j=0}^{\infty} a_{i,j} V_m^i(t - mjT) + CTs \quad (3)$$

wherein, i denotes the non-linear order, j denotes the memory in time, and CTs denote the cross terms, which in accordance with one embodiment of the invention may be ignored.

In accordance with one embodiment of the invention, samples of baseband signals of $V_m$ and $V_a$ may be represented as $V_{bm}(k)$ and $V_{ba}(k)$ respectively, at the central frequency $\omega$. Substituting $V_m = \text{Re}(V_{bm}e^{j\omega t})$ and $V_{ba} = \text{Re}(V_a e^{j\omega t})$ into equation (3) and filtering out the DC and other high harmonic terms, equation (3) may be written as $$V_{ba}(k) = \sum_{i=1}^{m} \sum_{j=0}^{\infty} \frac{a_{2i-1,j} C_i^{2i-1} V_{bm}(k-mj) |V_{bm}(k-mj)|^{2i-2}}{2^{2i-2}} \quad (4)$$

$$= \sum_{i=0}^{m} \sum_{j=0}^{\infty} a'_{2i-1,j} V_{bm}(k-mj) |V_{bm}(k-mj)|^{2i-2}$$

wherein $C_i^{2i-1}$ denotes the binomial coefficient, and $d_{2i-1,j}$ denote the odd order coefficients of the amplifier's mathematical model. It is noted that the accuracy of the mathematical model is specifiable by determining the number of necessary terms that are included in the calculation of equation (4). In accordance with one embodiment of the invention, a finite number of coefficients, $a^1_{2i-1,j}$, is employed to represent the coefficients of the mathematical model of amplifier 62.

At step 122, signal processing circuit 80 also obtains a corresponding input signal sample $V_{bm}(k)$ to employ in calculations of equation (4). At step 124, baseband signal $V_{bd}(k)$, corresponding to error signal, $V_{dd}$, is obtained. $V_{ba}(k)$ is also calculated by obtaining $$\frac{1}{\alpha(k-1)}(V_{bd}(k) + V_{bm}(k))$$

at step 124. At step 126, signal processing circuit 80 employs a recursive algorithm known as recursive least square, RLS, algorithm to solve equation (4) based on measured samples of $V_{bm}$ and $V_{ba}$ to adaptively obtain the coefficients "$a_{2i-i,-j}$" of the model that represents the operating point of amplifier 62. The RLS algorithm is well known and described, for example, in Haykin, S. *Adaptive Filter Theory*, 3rd. Ed. (Prentice Hall, 1996), and incorporated herein by reference.

At step 128 signal processing circuit 80 obtains the input signal statistics as explained in more detail below. The signal cancellation adjustment signal, $\alpha$, can be then obtained at step 130 based on the recursive calculations of amplifier coefficients "$a_{2i-1,-j}$" and input signal statistics as $$\alpha = \left( \sum_{i=1}^{m} \sum_{j=0}^{\infty} a_{2i-1,j} \rho_{i,j} \right)^{-1} \quad (5)$$

wherein the input signal statistics is defined in terms of the correlation $\rho_{ij}$, between input signal, $V_{bm}$, and the output signal of amplifier 62, $V_{ba}$, and can be written as $$\rho_{i,j} = \frac{E(V_{bm}^*(k) V_{bm}(k-mj) |V_{bm}(K-mj)|^{2i-2})}{E(V_{bm}^*(k) V_{bm}(k))} \quad (6)$$

where E(.) denotes the expectation value over time and $V^*_{bm}$ is the complex conjugate of the input signal $V_{bm}$. In effect, $\rho_{ij}$ is a measure of the amount of input signal components, $V_m$ in the output signal $V_a$ of the amplifier. Thus, in accordance with one embodiment of the present invention, parameter $\alpha$ adjusts the output signal, $V_a$, of amplifier 62 so that the signal component in $V_a$ that is statistically correlated to input signal $V_m$ is substantially canceled in the error cancellation loop 86.

Correlation terms, $\rho_{ij}$ can be calculated based, among other things, on the input signal power and the modulation scheme. For example, in a wireless communications environment the input signal power provided to amplifier 62 depends, among other things, on the number of users that require servicing, and the modulation scheme may be an appropriate pulse-shaping function such as a sinusoid, although the invention is not limited in scope in that respect. For example, various pulse shaping functions may be employed such as those discussed in Schwartz, *Information Transmission, Modulation, And Noise*, 3rd Ed. (McGraw Hill (1980). Assuming a linear modulation scheme, $V_{bm}$ can be written as $$V_{bm}(k) = \sum_d \sqrt{p_d} \sum_{k=0}^{i} g(h) S_d(k-h) \quad (7)$$

wherein d is the index corresponding to the users, $P_d$ is the root mean squared power of the signal intended for the $d^{th}$ user, g(h) is the discrete pulse-shaping function of the modulation scheme, after sampling, {Sd} is the data sequence of the $d^{th}$ user, and l is the length of the pulse shaping function.

The denominator of equation (6) can be simplified as follows:

$$E(V_m^*(k) V_m(k)) = \sum_{d_1} \sum_{d_2} \sqrt{P_{d_1} P_{d_2}} \sum_{h_1=0}^{l} \sum_{h_2=0}^{l} g^*(h_1) g(h_2) E(S_d^*(k-h_1) S_d(k-h_2)) \quad (8)$$

-continued $$= \sum_d P_d \sum_{h=0}^{l} |g(h)|^2$$

$$= q(0) \sum_d P_d$$

wherein q is defined as q(h)=g(h)*g(−h). For the derivation of equation (7) it is preferably assumed that data bits are independent between users and between time samples. The numerator of $\rho_{ij}$ can be similarly simplified so that $$E(V_m^*(k)V_m(k-mj)|V_m(k-mj)|^{2i-2}) = q^{i-1}(0)q(mj)\sum_d P_d^i \quad (9)$$

therefore, $$\rho_{i,j} = \frac{q^{i-1}(0)q(mj)\sum_d P_d^i}{q(0)\sum_d P_d} = q^{i-2}(0)q(mj)\sum_d \frac{P_d^i}{\sum_d P_d} \quad (10)$$

It will be appreciated by those skilled in the art that the term $q_{i-2}(0)$ q (mj) in equation (10) is advantageously precalculated by signal processing circuit 80 (FIG. 2) in accordance with one embodiment of the present invention, based on the prior knowledge of pulse-shaping functions applied to input signals.

At step 132 digital signal processor 76 provides the calculated adjustment signal a to vector modulator 66 in FIG. 2. At step 134 signal processing circuit 80 waits until the coefficients of amplifier model and the corresponding a have been stabilized. Thereafter, at step 135, baseband signal $V_{bd}$ and $V_0$ are obtained. At step 136 is performed to obtain the error cancellation adjustment signal β as described hereinafter.

In error cancellation loop 88, the value of signal β is adaptively adjusted to be equal to r/h, wherein r is the attenuation factor provided by attenuator 64 (FIG. 2) and h is the amplification factor of auxiliary amplifier 72 (FIG. 2). Both the attenuator and the auxiliary amplifier exhibit a substantially linear response, and as such respond independently from input signal statistics. As such, adjustment signal, β, is substantially insensitive to the fast-varying signal statistics and is deemed capable to tolerate a slower convergence algorithm, such as Least Mean Square algorithm for its derivation. Thus the value of β is updated by $$\beta(k)=\beta(k-1)+\mu V_o(k)V^*_d(k) \quad (11)$$

wherein $\mu$ is the step-size employed in the calculations in accordance with the Least Mean Square, LMS, algorithm and $V_{bo}$(k is the sampled baseband signal of $V_o$. It is noted that β is intended to modulate the error signal, $V_d$, so that it has substantially no correlation with output signal $V_o$. At step 138 the value of β is applied to modulator 70 in accordance with one embodiment of the invention. Steps 135 through 138 are repeated thereafter.

FIGS. 4 and 5 are plots of simulation results to illustrate the convergence speed of linearizer 60 in accordance with one embodiment of the present invention. For the purposes of the simulation, before the zeroth sample, the input signal consists of four tones with unit amplitude which are place 600 k Hz apart. After sample zero, the input signal consists of eight tones with unit amplitude which are placed 300 kHz apart. The center frequency is at 900 MHZ. Temperature and other environmental factors are assumed to be constant around sample zero. In accordance with one embodiment of the invention, the amplifier model employed in the simulation has up to third order non-linearity and one symbol channel memory with its normalized coefficients [$a_{1,1}$, $a_{1,2}$, $a_{3,1}$, $a_{3,2}$]=[1,0.1; 0.05, 0.0].

Figure 4A:
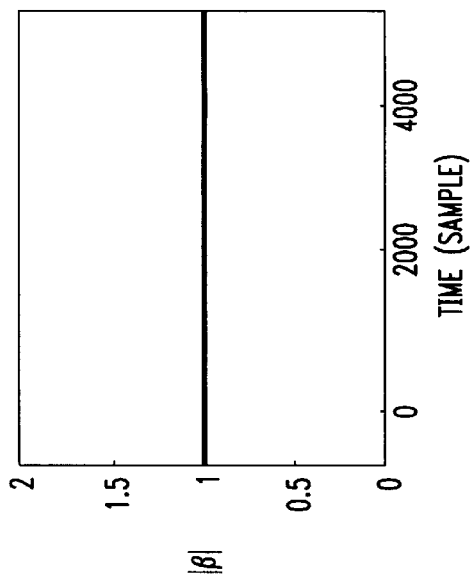
FIGS. 4a and 4b illustrate a plot representing the learning curves of adjustment signal, α and β.
Figure 5A:
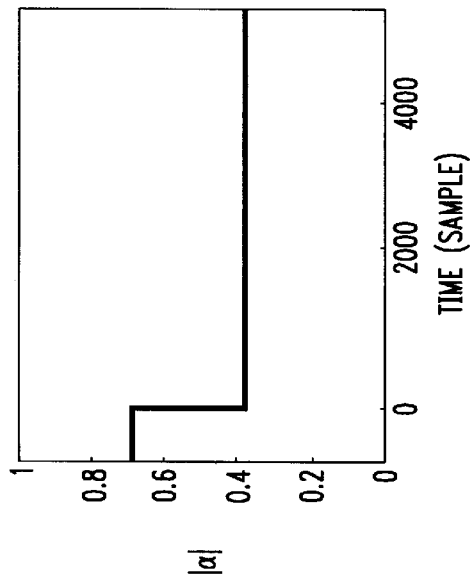
FIGS. 5a–5b illustrate the simulation results of the computations made by the signal processor in accordance with the present invention.
Figure 4B:
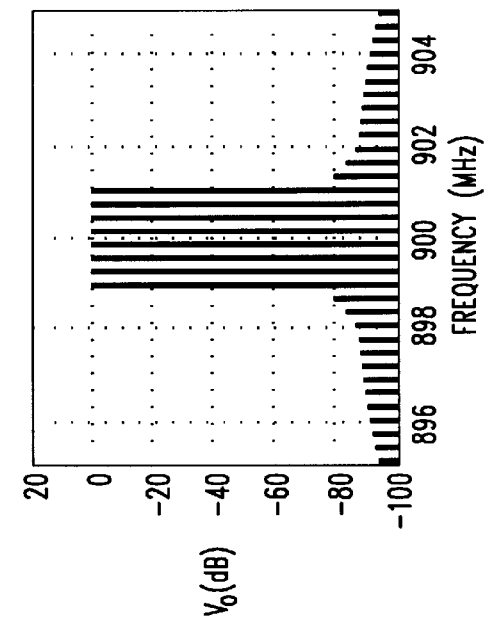
Figure 5B:
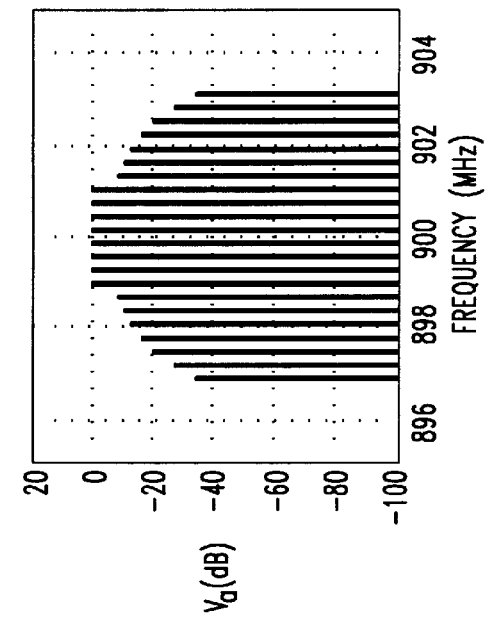

Thus, FIG. 4(a) illustrates the power spectrum of amplifier 62 output signal, $V_a$, and FIG. 4(b) illustrates the power spectrum of output signal, $V_o$, respectively, long after convergence. FIGS. 5(a) and 5(b) illustrates the convergence curve and the absolute value of the adjustment signals, α and β, respectively. Because, the adaptation of adjustment signal, α is independent of the variations of the input signal statistics, the value of α as illustrated in FIG. 5(a) converges rather immediately, and the value of adjustment signal, β remains unchanged.

Thus, based on the principles taught in accordance with the present invention, a feedforward linearizer is provided that exhibits a substantially fast convergence speed. The signal cancellation adjustment signal, α is obtained based on apriori knowledge of input signal statistics and a mathematical model of amplifier 62. Furthermore, because the signal cancellation vector modulator is located after the amplifier, the calculation of α formed by signal processing circuit 80 is only required to solve a simple linear equation, which results in equation (5). Otherwise, a non-linear equation needs to be solved.

While only certain features of the invention have been illustrated and described herein, many modifications, substitutions, changes or equivalents will now occur to those skilled in the art. It is therefore, to be understood that the appended claims are intended to cover all such modifications and changes that fall within the true spirit of the invention.

We claim:

1. A feedforward linearizer for amplifying an input signal comprises:

a signal cancellation circuit having a first signal cancellation branch and a second signal cancellation branch;

a first amplifier provided in said first signal cancellation branch, said amplifier configured to receive said input signal intended to be amplified;

a signal cancellation vector modulator coupled to said first amplifier, and configured to receive an output signal provided by said first amplifier;

a signal cancellation adder coupled to said signal cancellation vector modulator and configured to receive the signal generated by said signal cancellation vector modulator, said signal cancellation adder configured to receive said input signal via said second signal cancellation branch and to provide an error signal;

an error cancellation circuit having a first error cancellation branch and a second error cancellation branch;

an error cancellation adder in said first error cancellation branch, said error cancellation adder configured to receive the output signal provided by said first amplifier, the output of said error cancellation adder provide the output signal of said linearizer;

an error cancellation vector modulator in said second error cancellation branch, configured to receive said error signal provided by said signal cancellation adder and provide an error adjusted signal;

a second auxiliary amplifier coupled to said error cancellation vector modulator configured to provide an input signal to said error cancellation adder; and a digital signal processor configured to provide a signal cancellation adjustment signal, α, to said signal cancellation vector modulator and an error cancellation adjustment signal, β, to said error cancellation vector modulator respectively, such that the output signal of said signal cancellation adder is a signal that substantially represents the error components provided by said first amplifier, and the output signal of the error cancellation adder is an amplified version of the input signal, with substantially no intermodulation components.

2. The feedforward linearizer in accordance with claim 1, wherein said digital signal processor comprises a memory device that stores a mathematical model of said first amplifier.

3. The feedforward linearizer in accordance with claim 2, wherein said digital signal processor comprises a Recursive Least Square calculator that calculates the coefficients of said mathematical model of said first amplifier by employing a Recursive Least Square algorithrn.

4. The feedforward linearizer in accordance with claim 3, wherein said memory device stores the statistical measurements corresponding to said input signal intended to be amplified.

5. The feedforward linearizer in accordance with claim 4, wherein said digital signal processor comprises a correlation calculator that calculates the correlation, $\rho_{ij}$ between said input signal intended to be amplified and said output signal of said first amplifier.

6. The feedforward linearizer in accordance with claim 5, wherein said digital signal processor calculates said adjustment signal, α, based on said calculated amplifier coefficients and said calculated correlation.

7. The feedforward linearizer in accordance with claim 2, wherein said digital signal processor comprises a Least Mean Square calculator that calculates said adjustment signal, β by employing a Least Square means algorithm.

8. The feedforward linearizer in accordance with claim 1 further comprising an attenuator coupled to said first amplifier and configured to receive said amplified signals provided by said first amplifier and attenuate said signals so as to provide an attenuated version of said amplified signals to said signal cancellation vector modulator.

9. An integrated circuit comprising a feedforward linearizer in accordance with claim 1.

10. The feedforward linearizer in accordance with claim 2 wherein said mathematical model is defined as $$V_{ba}(k) = \sum_{i=1}^{m} \sum_{j=0}^{\infty} \frac{a_{2i-1,j} C_i^{2i-1} V_{bm}(k-mj)|V_{bm}(k-mj)|^{2i-2}}{2^{2i-2}}$$

wherein $V_{ba}$ represents the baseband output signal of said amplifier, $V_{bm}$ represents the baseband input signal of said amplifier, i denotes the non-linear order, j denotes the memory, $C_i^{2i-1}$ represents the binomial coefficients and $a_{2i-1j}$ represents the amplifier coefficients.

11. The feedforward linearizer in accordance with claim 6 wherein said adjustment signal, α is calculated as $$\alpha = \left( \sum_{i=1}^{m} \sum_{j=0}^{\infty} a_{2i-1,j} \rho_{i,j} \right)^{-1}$$

wherein $\rho_{ij}$ denotes said calculated correlation.

12. In a feedforward linearizer a method for linearizing an amplifier by deriving an error signal corresponding to distortions deemed generated by said amplifier, and applying an adjusted version of said error signal to the output signal of said amplifier so as to provide a substantially error free amplified version of said output signal, said method comprising the steps of:

(a) calculating a set of coefficients corresponding to a mathematical model of said amplifier;

(b) calculating a set of correlation values, $\rho_{ij}$, between the input signal and said output signal of said amplifier;

(c) calculating a signal cancellation adjustment signal based on said calculated coefficients and said calculated correlation values;

(d) applying said calculated signal cancellation adjustment signal to said output signal of said amplifier so as to derive an adjusted output signal of said amplifier; and (e) calculating a difference between said adjusted output signal and said input signal so as to derive said error signal.

13. The method in accordance with claim 12, wherein said step of calculating said coefficients comprises the steps of adopting a mathematical model that represents the characteristics of said amplifier;

measuring the baseband signal samples representing the input signal provided to said amplifier and the output signal provided by said amplifier; and solving for said coefficients by employing said measured signal samples in said mathematical model.

14. The method in accordance with claim 13, wherein said step of adopting said mathematical model comprises the step of employing a model equation such that $$V_{ba}(k) = \sum_{i=1}^{m} \sum_{j=0}^{\infty} \frac{a_{2i-1,j} C_i^{2i-1} V_{bm}(k-mj)|V_{bm}(k-mj)|^{2i-2}}{2^{2i-2}}$$

wherein $V_{ba}$ represents the output signal of said amplifier, $V_{bm}$ represents the input signal of said amplifier, i denotes the non-linear order, j denotes the memory, $C_i^{2i-1}$ represents the binomial coefficients and $a2i-_{ij}$ represents the amplifier coefficients.

15. The method in accordance with claim 13 wherein said solving step comprises the steps of applying a Recursive Least Square algorithm.

16. The method in accordance with claim 13, wherein said step of calculating said signal cancellation adjustment signal, α, further comprises the step of employing $$\alpha = \left( \sum_{i=1}^{m} \sum_{j=0}^{\infty} a_{2i-1,j} \rho_{i,j} \right)^{-1}$$

wherein $\rho_{ij}$ denotes said calculated correlation.

17. The method according to claim 12, further comprising the step of adjusting said error signal by applying a calculated error cancellation adjustment signal such that the output signal of said linearizer is an amplified version of said input signal with substantially no error signals.

* * * * *